(12) United States Patent
Edamura et al.

(10) Patent No.: US 6,933,581 B2
(45) Date of Patent: Aug. 23, 2005

(54) SEMICONDUCTOR CHIP, TERAHERTZ ELECTROMAGNETIC-WAVE DEVICE, AND METHOD OF MANUFACTURING THESE

(75) Inventors: Tadataka Edamura, Hamamatsu (JP); Minoru Niigaki, Hamamatsu (JP)

(73) Assignee: Hamamatsu Photonics K.K., Shizuoka (JP)

(*) Notice: Subject to any disclaimer, the term of this patent is extended or adjusted under 35 U.S.C. 154(b) by 0 days.

(21) Appl. No.: 10/823,575

(22) Filed: Apr. 14, 2004

(65) Prior Publication Data

US 2004/0207032 A1 Oct. 21, 2004

(30) Foreign Application Priority Data

Apr. 18, 2003 (JP) .................................. P2003-114680

(51) Int. Cl.⁷ .................... H01L 27/14; H01L 29/82; H01L 29/84
(52) U.S. Cl. .................... 257/414; 257/421
(58) Field of Search .................... 257/20–40, 78, 257/414–422

(56) References Cited

U.S. PATENT DOCUMENTS

| | | | | |
|---|---|---|---|---|
| 4,831,340 A | * | 5/1989 | Sollner | .................... 257/25 |
| 6,124,964 A | * | 9/2000 | Imanishi et al. | .................... 257/21 |

FOREIGN PATENT DOCUMENTS

| | | |
|---|---|---|
| JP | 07-036064 | 2/1995 |
| JP | 2002-257629 | 9/2002 |

OTHER PUBLICATIONS

Gupta et al.; "Ultrafast Carrier Dynamics in III–V Semiconductors Grown by Molecular–Beam Epitaxy at Very Low Substrate Temperatures"; IEEE Journal of Quantum Electronics; vol. 28; No. 10; pp. 2464–2472; (1982).

Tani et al.; "Applications of Terahertz Spectroscopy"; Ministry of Posts and Telecommunications, Telecommunications Multi–disciplinary Research Center, pp. 79–90.

Ogawa et al., "GaAs Ultrafast Photoconductive Switches and Their Application to Ultrafast Photonic Sampling Technology"; Appl. Phys. Letter, vol. 66, (1995), pp. 2–12.

Sakai et al.; "Terahertz Optoelectronics"; Excerpts, vol. 70, No. 2, (2001), pp. 149–155.

Kaminska et al.; "Structural Properties of As–rich GaAs Grown by Molecular Beam Epitaxy at Low Temperatures"; Appl. Phys. Letter; vol. 54; No. 19, (1989); pp. 1881–1883.

(Continued)

Primary Examiner—Cuong Nguyen
(74) Attorney, Agent, or Firm—Morgan Lewis & Bockius LLP (57) ABSTRACT

The present invention relates to a semiconductor chip and the like provided with a structure, which is applicable to a terahertz electromagnetic-wave device and capable of further reducing the life of the carriers. The semiconductor chip comprises a single crystal semiconductor substrate and a Group III-V compound semiconductor layer. The Group III-V compound semiconductor layer is characterized in that, in the vicinity of the surface, the concentration of Group V atoms is higher than the concentration of Group III atoms, and in that oxygen is included therein. In the Group III-V compound semiconductor layer, many As-clusters are deposited. It is known that the As-clusters function as a main factor for capturing the carriers; particularly, it is known that As-clusters near the upper surface of the Group III-V compound semiconductor layer contribute to the capture of carriers. Also, the Group III-V compound semiconductor layer includes oxygen; and due to this oxygen, a deep level is formed. Accordingly, in this semiconductor chip, the As-clusters near the upper surface significantly increase, and the life of the carriers can be further reduced due to the included oxygen.

4 Claims, 5 Drawing Sheets

OTHER PUBLICATIONS

Warren et al.; "Arsenic Precipitates and the Semi–Insulating Properties of GaAs Buffer Layers Grown by Low–Temperatures Molecular Beam Epitaxy"; Appl. Phys. Letter; vol. 57; No. 13; (1990); pp. 1331–1333.

Fan et al.; "Thermal Stability of Low–Temperature–Grown GaAS"; Journal of Crystal Growth; vol. 143; (1994); pp. 354–358.

Tadayon et al.; "Characterization of Low Range GaAs"; Journal of Electronic Materials; vol. 24, No. 11; (1995); pp. 1753–1758.

Smith et al; "Picosecond GaAs–based Photoconductive Optoelectronic Detectors"; Appl. Phys. Letter; vol. 54; No. 10; (1989); pp. 890–892.

Look; "Molecular Beam Epitaxial GaAs Grown at Low Temperatures"; Thin Solid Films; vol. 231; (1993); pp. 61–73.

\* cited by examiner

SEMICONDUCTOR CHIP, TERAHERTZ ELECTROMAGNETIC-WAVE DEVICE, AND METHOD OF MANUFACTURING THESE

FIELD OF TECHNOLOGY

The present invention relates to a terahertz electromagnetic-wave device for generating and detecting terahertz electromagnetic waves, a semiconductor chip applicable to the terahertz electromagnetic-wave device, and a method of manufacturing these.

RELATED BACKGROUND ART

Recently, the electromagnetic wave of the terahertz band (THz band), which is the boundary zone between light and radio waves, increasingly attracts interests. In many cases, the terahertz electromagnetic wave generally means the electromagnetic wave in a frequency domain of 100 GHz–10 THz, and the wavelength thereof is approximately not more than 300 μm. It is expected that the above terahertz electromagnetic wave be applied to nondestructive inspection, imaging, communication or the like. The application of terahertz electromagnetic wave has expanded to a field of environmental measurement and life science; thus, the terahertz electromagnetic wave has emerged as a field of leading basic technology.

One of the devices that generate and detect such terahertz electromagnetic wave is an optical switch element (terahertz electromagnetic-wave device). That is, the optical switch element is capable of generating and detecting the terahertz electromagnetic wave by being pumped by a femtosecond laser pulse. Therefore, the optical switch element is required to operate at an ultra high speed so as to respond to the femtosecond laser pulse. In addition to the above, the semiconductor material used in the substrate portion of the optical switch element, which generates carriers by means of pumping of the laser pulse, is required such characteristics as high resistance, high mobility, short carrier life time and the like. In these required characteristics, the characteristic of the carrier life time affects largely on the detection area and the SN-ratio when the optical switch element is applied to detect the terahertz electromagnetic wave. Therefore, the characteristic of the carrier life time is particularly important.

As a method of obtaining a semiconductor substrate with a short carrier life time to be applied to the above-mentioned optical switch element, a conventional method, in which crystal defects are introduced into the substrate by means of ion implantation, is known. According to this method, the crystal defects function as an essential element that captures the carriers. And thus, a semiconductor substrate, of which carrier life time is approximately 1 ps, can be obtained. However, in the method, in which the carrier life time is made to be short by means of the ion implantation, there resides such problem that the mobility, which is one of the required characteristics for the optical switch element, is greatly reduced.

Therefore, in many cases, a semiconductor substrate (LT-GaAs substrate), in which a GaAs epitaxial layer is grown on a semi-insulating substrate comprised of GaAs or the like at a substrate temperature lower than ordinal temperature by means of molecular beam epitaxy (MBE), is used. In this substrate, As is excessively implanted while the epitaxial layer is allowed to grow at a low temperature; and after that, the As is deposited as As-clusters by a required heat treatment. The As-clusters function as a main factor that captures the carriers. Owing to this, in this substrate, it is possible to obtain a short carrier life time and a relatively high mobility without causing a large damage on the crystal.

For example, in Document 1: S. Gupta, IEEE, J. Q. Elec., 28 (1992), pp. 2464, the above-mentioned LT-GaAs substrate is disclosed. By using this substrate, the carrier life time shorter than 1 ps and the mobility of approximately 100 to 200 $cm^2/Vs$ have been achieved. Also, in Document 2: the Japanese Laid-Open Patent Publication No. 2002-257629, a technique to generate terahertz electromagnetic wave and a technique to detect the same by using an optical switch element, in which a dipole antenna is formed on the LT-GaAs substrate with the life of the carriers reduced. Further, in Document 3: the Japanese Laid-Open Patent Publication No. 07-36064, a technique relevant to the reduction of the life of the carriers in an InGaAs compound semiconductor to be used in a 1.3 to 1.55 μm band, which is essential in the field of communication. By doping Be to a substrate, the carrier life time is reduced.

SUMMARY OF THE INVENTION

The inventors of the present invention examined the above conventional techniques, and as a result, discovered the following problems.

Namely, in the conventional optical switch element as a terahertz electromagnetic-wave device, when the life of photo-carrier, which is generated within an element by an irradiation of femtosecond laser pulse, is long, the SN-ratio is reduced by a noise component caused by the residual carriers. Therefore, it is required to further reduce the carrier life time. As disclosed in the Document 1, there is a technique to control the carrier life time by adjusting the substrate temperature while growing the epitaxial layer. However, in this technique, the dependency of the substrate on apparatus and the repeatability of the characteristics were low. Further, in the optical switch element, which was produced according to the method disclosed in the Document 3, the carrier life time in the element is approximately several ps, it is difficult to apply the same to the terahertz electromagnetic-wave device.

The present invention has been proposed to solve the above-mentioned problems. An object of the present invention is to provide a semiconductor chip, which has such a structure capable of reducing the carrier life time as compared with the conventional techniques, a method of manufacturing the semiconductor chip, a terahertz electromagnetic-wave device to which the semiconductor chip is applied, and a method of manufacturing the terahertz electromagnetic-wave device.

A semiconductor chip according to the present invention comprises a single crystal semiconductor substrate and a Group III-V compound semiconductor layer directly or indirectly epitaxial-grown on the single crystal semiconductor substrate.

In particular, in the semiconductor chip according to the present invention, the Group III-V compound semiconductor layer has a first main surface facing the single crystal semiconductor substrate and a second main surface opposed to the first main surface. Also, in the second main surface side of the Group III-V compound semiconductor layer, the concentration of Group V atoms is higher than the concentration of Group III atoms, and the Group III-V compound semiconductor layer includes oxygen.

As described above, in this semiconductor chip, the concentration of Group V atoms in the second main surface side of the Group III-V compound semiconductor layer is set higher than the concentration of the Group III atoms. Therefore, in the vicinity of the upper surface (second main surface) of the Group III-V compound semiconductor layer, many clusters of Group V atoms are deposited. It is known that these Group V atom clusters function as a main factor of the carrier capture. Specifically, it is known that the Group V atom clusters in the vicinity of the upper surface of the Group III-V compound semiconductor layer contribute largely to the carrier capture. Further, the Group III-V compound semiconductor layer includes the oxygen, and a deep level is formed due to the included oxygen. And the fact that the deep level formed by the oxygen contributes the reduction of the life of the carriers has been found by the inventors. Based on the above-mentioned facts, the semiconductor chip according to the present invention is capable of further reducing the life of the carriers.

Further, in the second main surface side of the semiconductor chip according to the present invention, the Group III-V compound semiconductor layer may be constituted so that the concentration of Group V atoms is higher than the concentration of the Group III atoms, and the ratio of the concentration of the Group V atoms with respect to the concentration of the Group III atoms increases from the first main surface toward the second main surface.

In this way, in the second main surface side of the semiconductor chip, the concentration of the Group V atoms of the Group III-V compound semiconductor layer is higher than the concentration of the Group III atoms. Accordingly, many clusters of the Group V atoms are deposited in the vicinity of upper surface (second main surface) of the Group III-V compound semiconductor layer. Also, in the Group III-V compound semiconductor layer, from the first main surface toward the second main surface, the ratio of the concentration of the Group V atoms with respect to the concentration of the Group III atoms increases. Accordingly, the ratio of the concentration in the first main surface side (a portion closer to the above-mentioned single crystal semiconductor substrate) in the Group III-V compound semiconductor layer is reduced to a certain low level. Owing to this, the uniformity of the crystal in the first main surface side of the Group III-V compound semiconductor layer is high. Thus, the semiconductor chip according to the present invention enables to further reduce the life of the carriers as well as the uniformity of the crystal in the first main surface side of the Group III-V compound semiconductor layer is ensured.

A terahertz electromagnetic-wave device according to the present invention comprises a single crystal semiconductor substrate, a Group III-V compound semiconductor layer, which is directly or indirectly epitaxial-grown on the single crystal semiconductor substrate, and a pair of antenna electrodes provided on the Group III-V compound semiconductor layer. The Group III-V compound semiconductor layer has a first main surface facing the single crystal semiconductor substrate and a second main surface opposed to the first main surface. Further, the a pair of antenna electrodes is provided so as to be separated from each other by a minute gap to constitute, for example, a dipole antenna or the like.

In particular, in the second main surface side of the Group III-V compound semiconductor layer, the concentration of Group V atoms of the Group III-V compound semiconductor layer is set so as to be higher than the concentration of Group III atoms, and the Group III-V compound semiconductor layer includes oxygen.

In this way, the terahertz electromagnetic-wave device is set so that the concentration of the Group V atoms is higher than the concentration of the Group III-V atoms, in the second main surface side of the Group III-V compound semiconductor layer. Accordingly, in the vicinity of the upper surface (second main surface) of the Group III-V compound semiconductor layer, many clusters of the Group V atoms are deposited. It is known that these Group V atom clusters function as a main factor of the carrier capture. Specifically, it is known that the Group V atom clusters in the vicinity of the upper surface of the Group III-V compound semiconductor layer contribute largely to the carrier capture. Further, the Group III-V compound semiconductor layer includes the oxygen, and a deep level is formed due to the oxygen. And, the following fact has been found by the inventors, and that is, the deep level formed by the oxygen contributes to the reduction of the life of the carriers. Accordingly, in the terahertz electromagnetic-wave device according to the present invention, a high-speed response can be achieved when the minute gap between the pair of antenna electrodes is irradiated with femtosecond laser.

Further, in the terahertz electromagnetic-wave device according to the present invention, the Group III-V compound semiconductor layer may be set so that the concentration of the Group V atoms is higher than the concentration of the Group III atoms in the second main surface side thereof, and the ratio of the concentration of the Group V atoms with respect to the concentration of the Group III atoms increases from the first main surface toward the second main surface.

In this way, in the terahertz electromagnetic-wave device, also in such a constitution that the concentration of the Group V atoms is higher than the concentration of the Group III atoms in the second main surface side of the Group III-V compound semiconductor layer, many clusters of the Group V atoms are deposited in the vicinity of the upper surface (second main surface) of the Group III-V compound semiconductor layer. Thus, in the terahertz electromagnetic-wave device, owing to such constitution that the clusters of the Group V atoms in the vicinity of the upper surface of the Group III-V compound semiconductor layer increase significantly, the life of the carriers can be further reduced. Accordingly, in the terahertz electromagnetic-wave device according to the present invention, a high-speed response can be achieved when the minute gap between the pair of antenna electrodes is irradiated with femtosecond laser. Further, the Group III-V compound semiconductor layer is arranged so that the ratio of the concentration of the Group V atoms with respect to the concentration of the Group III atoms increases from the first main surface toward the second main surface. Accordingly, in the first main surface side (in a portion closer to the single crystal semiconductor substrate) of the Group III-V compound semiconductor layer, the concentration rate is reduced to a certain level. Accordingly, the uniformity of the crystal in the first main surface side of the Group III-V compound semiconductor layer is increased.

A method of manufacturing the above-mentioned semiconductor chip (a method of manufacturing the semiconductor chip according to the present invention) comprises of the following steps of; preparing the single crystal semiconductor substrate; and epitaxial growing the Group III-V compound semiconductor layer directly or indirectly on the single crystal semiconductor substrate. Further, the Group III-V compound semiconductor layer, obtained on the single crystal semiconductor layer by the epitaxial growth, has the first main surface facing the single crystal semiconductor layer and the second main surface opposed to the first main surface. In addition thereto, the epitaxial growth is carried out under such conditions that the supply amount of the Group V material is increased and the substrate temperature is lowered. Owing to this, the Group III-V compound semiconductor layer is set so that the concentration of the Group V atoms is higher than the concentration of the Group III atoms in the second main surface side thereof, and oxygen is included therein.

Further, in the meth of manufacturing the semiconductor chip according to the present invention, the epitaxial growth for forming the Group III-V compound semiconductor layer directly or indirectly on the single crystal semiconductor substrate may be carried out while increasing the supply amount of Group V material and lowering the substrate temperature. In this way, it is arranged so that, in the second main surface side of the obtained Group III-V compound semiconductor layer, the concentration of the Group V atoms is higher than the concentration of the Group III atoms as well as the ratio of the concentration of the Group V atoms with respect to the concentration of the Group III atoms increases from the first main surface toward the second main surface.

A method of manufacturing the terahertz electromagnetic-wave device, which has the structure as described above (a manufacturing method of the terahertz electromagnetic-wave device according to the present invention) comprises the following steps of; preparing the single crystal semiconductor substrate; epitaxial growing the Group III-V compound semiconductor layer directly or indirectly on the single crystal semiconductor substrate; and forming a pair of antenna electrodes on the Group III-V compound semiconductor layer. The Group III-V compound semiconductor layer, obtained on the single crystal semiconductor layer by the epitaxial growth, has the first main surface facing the single crystal semiconductor layer and the second main surface opposed to the first main surface. Also, the pair of antenna electrodes has a structure such as, for example, dipole antenna, being separated by a minute gap. The epitaxial growth is carried out under such conditions that the supply amount of the Group V material is increased and the substrate temperature is lowered. In this way, the Group III-V compound semiconductor layer is set so that the concentration of the Group V atoms is higher than the concentration of the Group III atoms in the second main surface side thereof, and oxygen is included therein.

Further, in the method of manufacturing the terahertz electromagnetic-wave device according to the present invention, the epitaxial growth for forming the Group III-V compound semiconductor layer directly or indirectly on the single crystal semiconductor substrate may be carried out while increasing the supply amount of Group V material and lowering the substrate temperature. In this way, it is arranged so that, in the second main surface side of the obtained Group III-V compound semiconductor layer, the concentration of the Group V atoms in is higher than the concentration of the Group III atoms as well as the ratio of the concentration of the Group V atoms with respect to the concentration of the Group III atoms increases from the first main surface toward the second main surface.

The invention will be more fully understood from the detailed description given hereinbelow and the accompanying drawings, which are given by way of illustration only and are not to be considered as limiting the invention.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of a semiconductor chip, a terahertz electromagnetic-wave device, and a method of manufacturing method these according to the present invention will be described in detail with reference to FIGS. 1–2, 3A–3B, and 4–5. In the descriptions of the drawings, the same or equivalent elements will be given with the same reference numerals and symbols, and duplicate descriptions thereof will be omitted.

Figure 1:
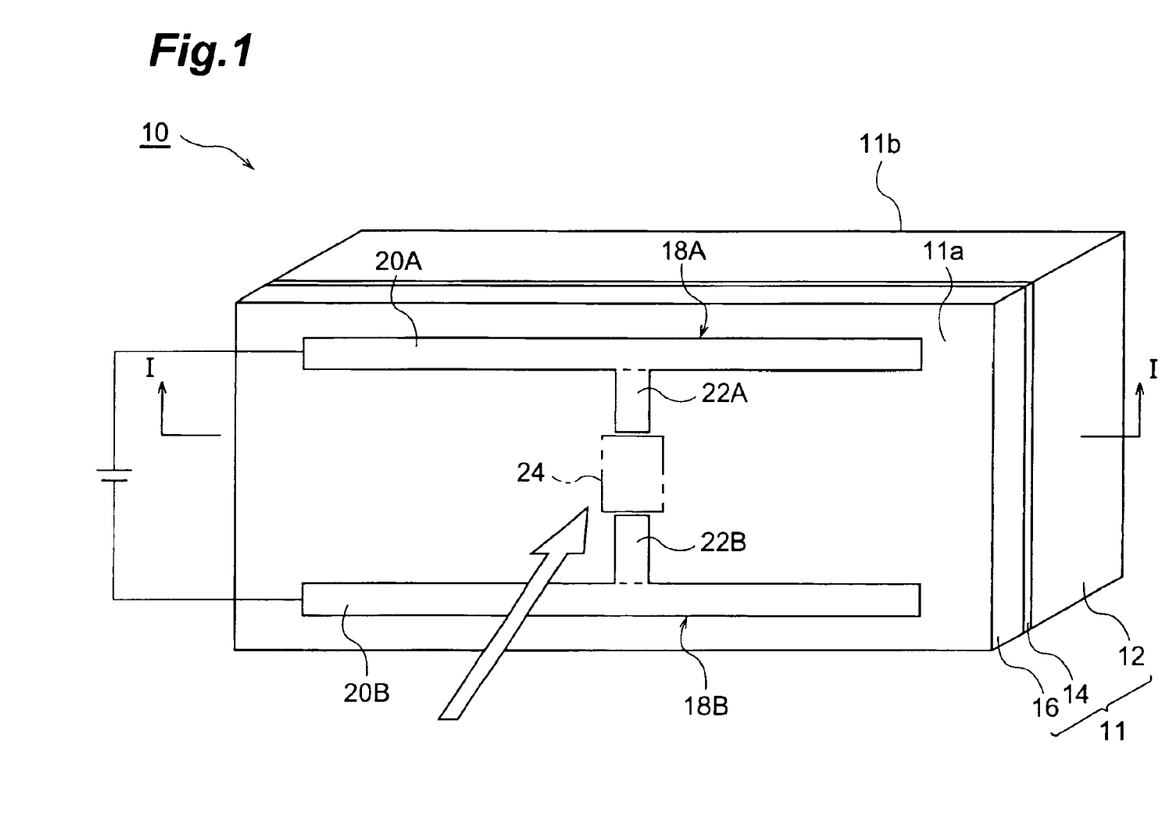
FIG. 1 is a perspective view showing a configuration of one embodiment of a terahertz electromagnetic-wave device according to the present invention.

FIG. 1 is a perspective view showing a configuration of one embodiment of a terahertz electromagnetic-wave device according to the present invention. As shown in FIG. 1, the terahertz electromagnetic-wave device 10 comprises a semiconductor chip 11 cut up into a rectangular shape. The semiconductor chip 11 comprises a GaAs single crystal substrate (single crystal semiconductor substrate) 12, and an epitaxial layer (Group III-V compound semiconductor layer) 16 laminated on the substrate 12 through a GaAs buffer layer 14. And, a dipole antenna, including a pair of antenna electrodes 18A and 18B that serve as a transmission channel as well as an antenna respectively, is formed on the epitaxial layer 16 of the semiconductor chip 11.

The antenna electrodes 18A and 18B constituting the dipole antenna have two rails 20A and 20B, which are parallel with each other, and projections 22A and 22B extending from the center of the respective rails 20A and 20B so as to face each other. And, a minute gap 24 of approximately 5 $\mu$m is formed between the projection 22A on one antenna electrode 18A and the projection 22B on the other antenna electrode 18B. Hereinafter, for convenience of description, in the surfaces of the semiconductor chip 11, the surface on which the dipole antenna (the pair of antenna electrodes 18A and 18B), will be referred to as upper surface 11a; and the opposite surface thereof will be referred to as rear surface 11b.

Here, the generation of terahertz electromagnetic wave in the terahertz electromagnetic-wave device 10 will be explained. When the terahertz electromagnetic wave is generated with terahertz electromagnetic-wave device 10, first of all, a DC bias is applied between a pair of antenna electrodes 18A and 18B. Under a state that the DC bias is applied between the pair of antenna electrodes 18A and 18B, a femtosecond laser pulse is irradiated to the minute gap 24, thereby carriers are generated caused by light absorption at the epitaxial layer 16 in the minute gap 24. Due to the generation of the carriers, energization takes place between the pair of antenna electrodes 18A and 18B, and the terahertz (THz) electromagnetic wave is generated from the pair of antenna electrodes 18A and 18B. Since the dielectric constant of the GaAs in the terahertz band is approximately 12, the generated terahertz electromagnetic wave is emitted from the rear surface 11b of the semiconductor chip 11.

Next, the detection of the terahertz electromagnetic wave by the terahertz electromagnetic-wave device 10 will be explained. First of all, instead of a DC power supply for applying the DC bias, an ammeter is installed between the pair of antenna electrodes 18A and 18B. And, a femtosecond laser pulse is radiated to the minute gap 24 between the pair of antenna electrodes 18A and 18B as gate light. Under the above-mentioned state, when terahertz electromagnetic wave is radiated from the rear surface 11b of the semiconductor chip 11, the carriers generated by the gate light is modulated by the terahertz electromagnetic wave, and detected by the installed ammeter as a current signal which flows between the pair of antenna electrodes 18A and 18B. Owing to the detection of the current signal by the ammeter, the terahertz electromagnetic wave is detected.

Figure 2:
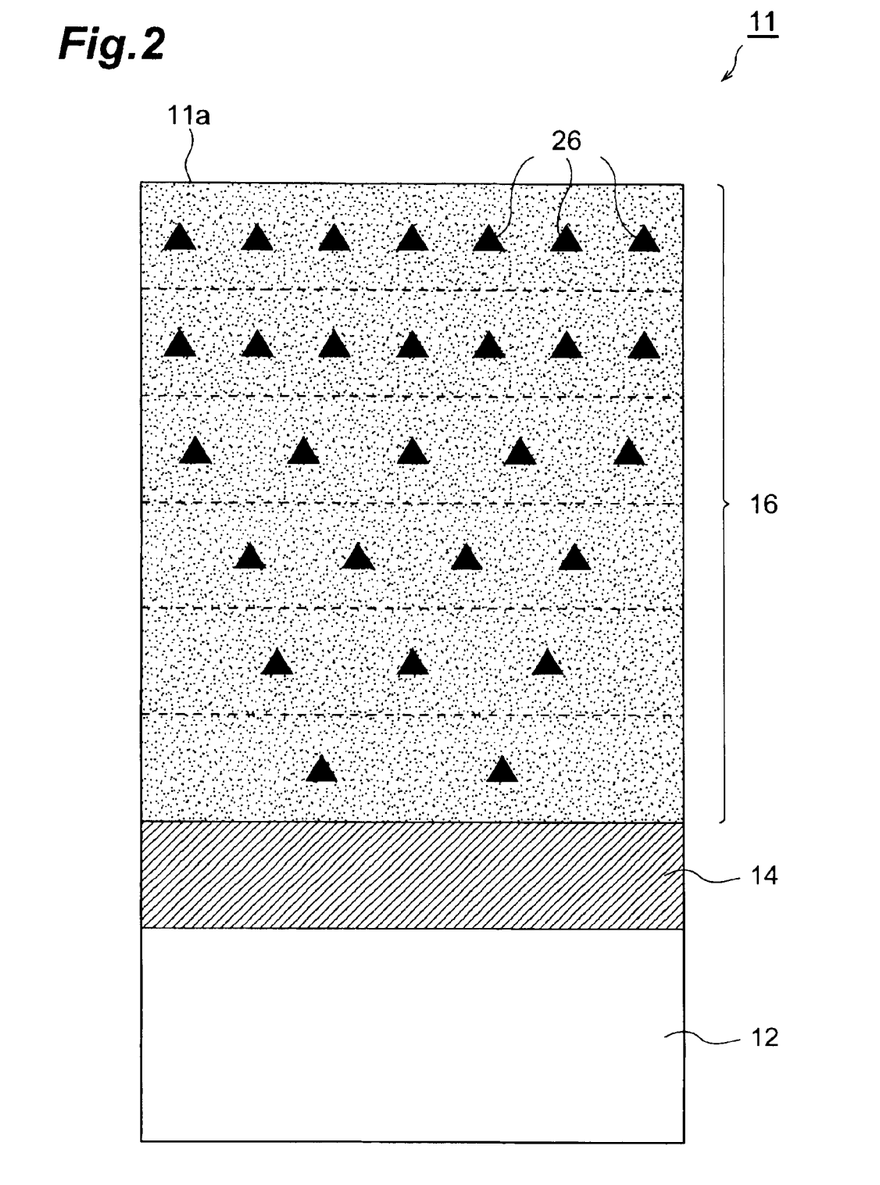
FIG. 2 is a sectional view schematically showing a laminated structure of the semiconductor chip taken along the line I—I in FIG. 1.

Next, the laminated structure of the semiconductor chip 11 in the terahertz electromagnetic-wave device 10 will be explained with reference to FIG. 2. FIG. 2 is a sectional view for schematically illustrating the laminated structure of the semiconductor chip 11 taken along the line I—I in FIG. 1. As shown in FIG. 2, a GaAs buffer layer 14 is laminated on a GaAs single crystal substrate 12. And, an epitaxial layer 16, including As-clusters (Group V atom clusters) 26, is laminated on the GaAs buffer layer 14. As shown in FIG. 2, the As-clusters 26 increases from the rear surface, which faces the GaAs single crystal substrate 12 (corresponding to the epitaxial layer 16 of a first main surface), toward the upper surface 11a of the semiconductor chip 11 (fitting the second main surface of the epitaxial layer 16).

In the following, a method of manufacturing the semiconductor chip 11 will be explained. First of all, a GaAs single crystal substrate 12 is set on an MBE (molecular beam epitaxy) apparatus as a solid source, and on the GaAs single crystal substrate 12, the GaAs buffer layer 14 is grown at approximately 0.1–0.2 $\mu$m with a known method. Specifically, the GaAs buffer layer 14 is grown under the following settings; i.e., substrate temperature is 590–600° C.; growing speed is 1 $\mu$m/h; and the ratio of the intensity of As molecular beam with respect to the intensity of Ga molecular beam (refer to as "As/Ga supply ratio") is approximately 5. As for the MBE apparatus, an MBE apparatus as a gas source may be used. Then, the substrate temperature is lowered to approximately 400° C., and the epitaxial layer 16 is grown at approximately 2 $\mu$m. The growing conditions such as growing speed, As/Ga supply ratio or the like are the same as the growing conditions for the GaAs buffer layer 14 excepting the substrate temperature.

When growing the epitaxial layer 16, the substrate temperature is gradually lowered every time when the growth reaches approximately 0.2–0.4 $\mu$m; and the As molecular beam intensity (i.e., As supply amount) is continuously increased; thereby the As/Ga supply ratio can be increased from the first main surface toward the second main surface of the epitaxial layer 16. When the thickness of the epitaxial layer 16 has reached approximately 2 $\mu$m, the substrate temperature is set to approximately 200° C.; and the As/Ga supply ratio is set to approximately 20. When the substrate temperature is less than 200° C., the epitaxial layer 16 crystallizes into a polycrystalline-state resulting in a cloud caused by reduction of the mobility of the carriers and the roughness of the upper surface 11a. Accordingly, it is preferred that the substrate temperature is not lowered to a temperature not more than 200° C.

Figure 3A:
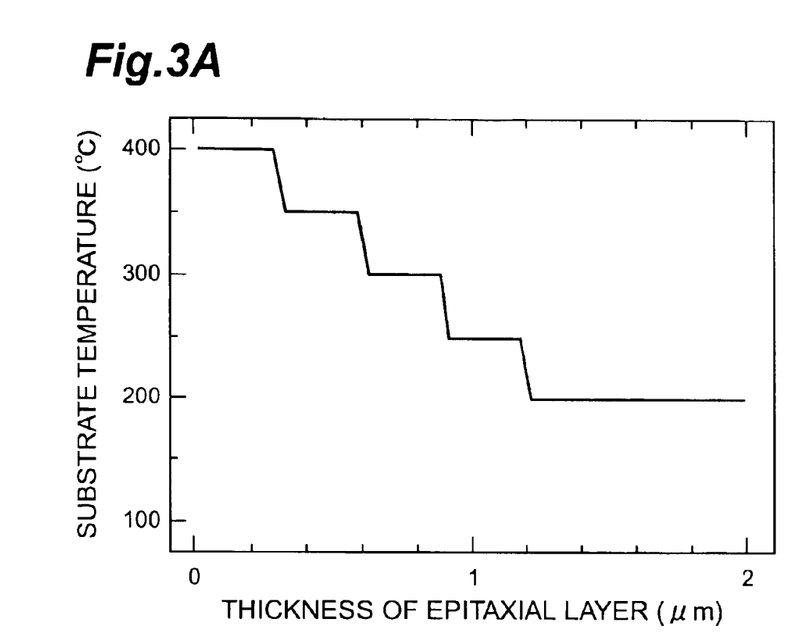
FIGS. 3A and 3B are graphs respectively showing the growing conditions of an epitaxial layer.
Figure 3B:
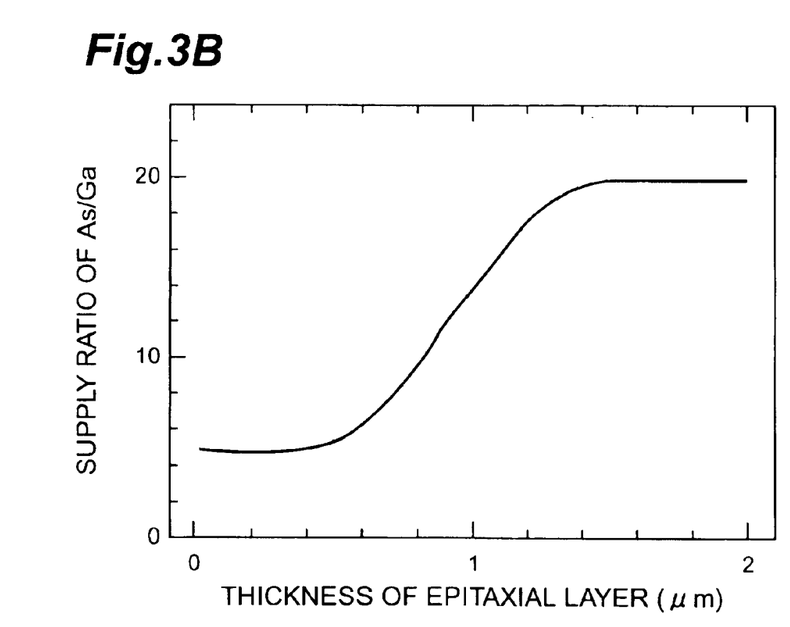

FIGS. 3A and 3B are graphs showing the growing conditions of the epitaxial layer 16 respectively. FIG. 3A shows growing conditions with respect to the substrate temperature; the abscissa axis thereof indicates the thickness ($\mu$m) of the epitaxial layer 16; and the ordinate axis thereof indicates the substrate temperature (° C.) during epitaxial growth. Also, FIG. 3B shows the growing conditions with respect to the As/Ga supply ratio; the abscissa axis thereof indicates the thickness ($\mu$m) of the epitaxial layer16; the ordinate axis thereof indicates the As/Ga supply ratio. After the epitaxial layer 16 has grown up, while radiating the As molecular beam to substrate 12 and setting the substrate temperature to 600° C., the substrate 12 is subjected to a heat treatment for approximately 5 minutes.

Figure 4:
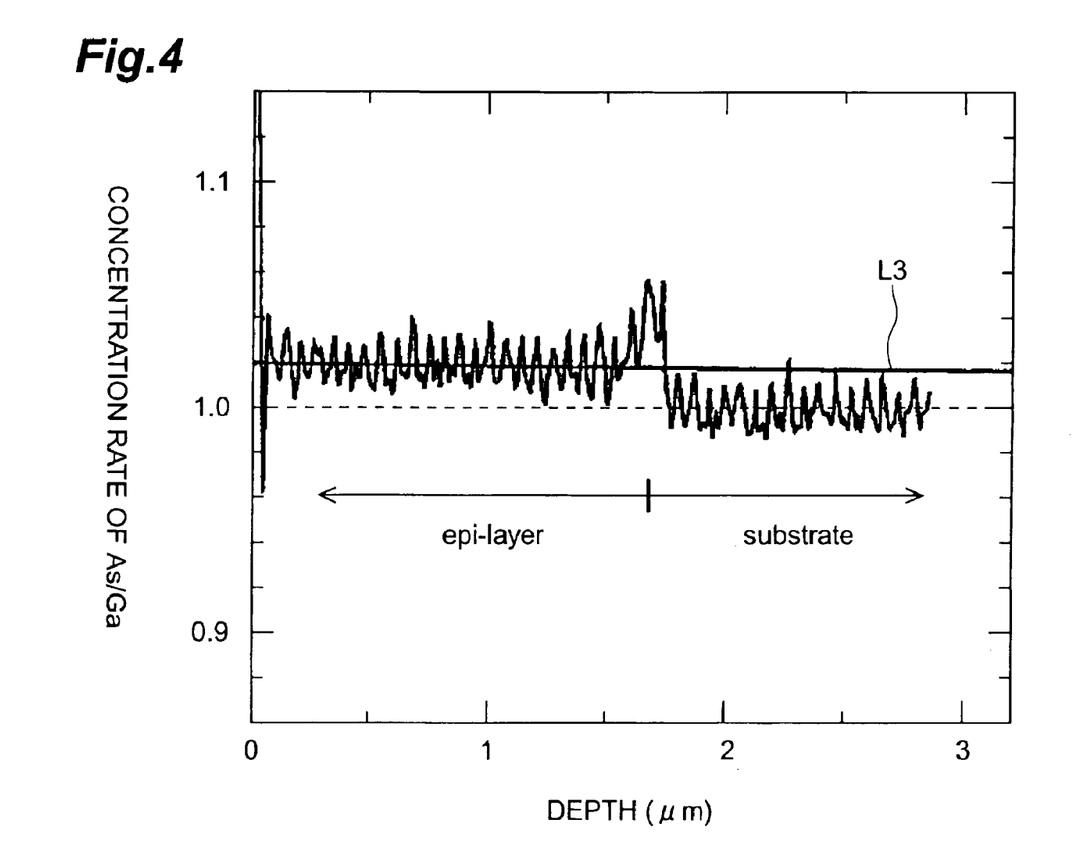
FIG. 4 is a graph showing the changes in As/Ga concentration rate with respect to the depth from the upper surface of the epitaxial layer.

Under the growing conditions of the epitaxial layer 16 as described above, the As/Ga supply ratio is gradually increases during the epitaxial growth. Accordingly, it is understood that the As concentration ratio with respect to the Ga concentration (As/Ga concentration rate) in the vicinity of the upper surface 11a of the epitaxial layer 16 becomes higher than the As/Ga concentration rate in the vicinity of the GaAs single crystal substrate 12. Here, as the As/Ga concentration rate was calculated using a secondary ion mass analysis (SIMS), the result shown in FIG. 4 was obtained. FIG. 4 is a graph showing the changes in the As/Ga concentration rate with respect to the depth of the epitaxial layer 16 from the upper surface 11a; the abscissa axis thereof indicates the depth ($\mu$m); and the ordinate axis indicates the As/Ga concentration rate.

As demonstrated in the graph, in the depth of approximately 1.7 $\mu$m or less where is corresponding to the epitaxial layer 16, the concentration rate of As/Ga is approximately 1.02; and in the depth of approximately 1.7 $\mu$m or more where is corresponding to the GaAs single crystal substrate 12, the concentration rate of As/Ga is substantially 1.00. In the area corresponding to the epitaxial layer 16 excluding the discontinuous uppermost surface and the area adjacent to the boundary of the substrate, the concentration rate of As/Ga decreases as the depth increases, and the relationship between the depth and the concentration rate of As/Ga in this area is approximated by the line L3, which decreases rightward. When the ordinate axis represents y and the abscissa axis represents x in FIG. 4, the expression of the line L3 is expressed by the following expression (1).

$$y = 1.020 - 0.0014x \quad (1)$$

Since the slope of the line L3 shown in the expression (1) is negative, it is verified that the concentration rate of As/Ga in the vicinity of the upper surface 11a of the epitaxial layer 16 is higher than the concentration rate of As/Ga in the vicinity of the GaAs single crystal substrate 12. In general, it is known that, when As is supplied excessively at a low substrate temperature lower than 400° C., the As is deposited as As-clusters in the GaAs crystal while being subjected to a heat treatment (at a substrate temperature of 600° C., for approximately 5 minutes), which will be carried out later. As described above, in the epitaxial layer 16, the closer to the upper surface 11a, the more amount of the As atoms becomes excessive, it is conceivable that, in the vicinity of surface 11a, more As-clusters 26 than the other area are deposited (see FIG. 2).

It is conventionally known that the As-clusters 26 function as a main factor that captures the carriers generated by an irradiation of the femtosecond laser pulse. Due to the increase of the As-clusters 26, the carrier life time is reduced. Additionally, the speed of response of the terahertz electromagnetic-wave device 10 is affected by the carrier mobility in directions along the upper surface 11a in the vicinity of the upper surface 11a. Accordingly, due to the fact that the As-clusters 26 are disposed preferentially in the vicinity of the upper surface 11a, the carrier life time is reduced more effectively.

In general, when the As/Ga supply ratio is too high, the Ga atoms tend to be prevented from migrating. Accordingly, it is difficult grow the crystal uniformly. In particular, under a low substrate temperature as described above, since fewer atoms are migrated, it is further difficult to allow the crystal to grow uniformly. Therefore, in general, it is understood that the conditions to obtain a high quality epitaxial layer 16 is the lowest As/Ga supply ratio that maintains the mirror surface. Therefore, as the above-mentioned growing method, by gradually increasing the As/Ga supply ratio from a relatively low As/Ga supply ratio, the amount of the As-clusters in the vicinity of the upper surface 11a is increased. Thus, a uniform crystal growth at the initial stage of the growth of the epitaxial layer 16 is ensured. As described above, by carrying out a uniform crystal growth of the epitaxial layer 16, the semiconductor chip 11 with a satisfactory growth surface and a high mobility of the carriers can be obtained.

Figure 5:
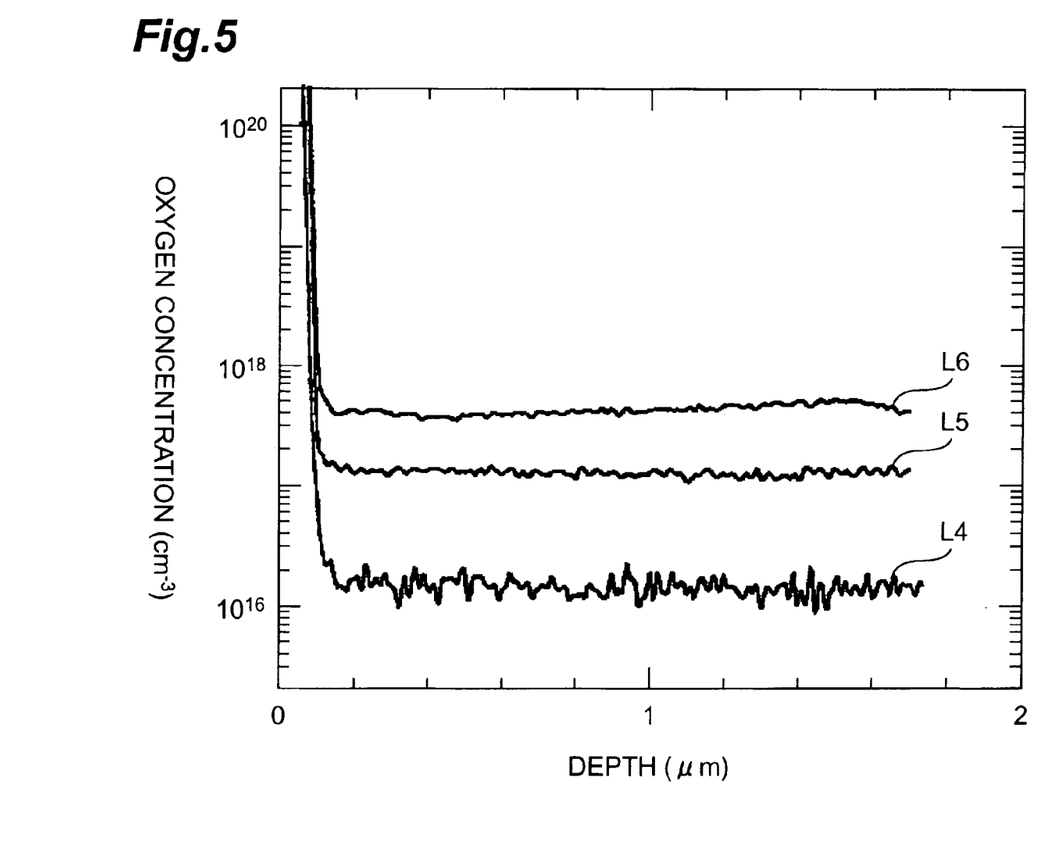
FIG. 5 is a graph showing measurement results of oxygen concentration in plural epitaxial layers different from each other in substrate temperature during epitaxial growing.

Further, in the above-mentioned growing conditions of the epitaxial layer 16, since the substrate temperature is a low temperature lower than 400° C., residual impurities in a growing chamber; particularly oxygen is implanted into the epitaxial layer 16. The oxygen implanted into the epitaxial layer 16 will be explained with reference to FIG. 5. FIG. 5 is a graph showing the measurement results of the concentration of the oxygen, which are obtained with SIMS analysis, in a plurality of epitaxial layers 16 of which substrate temperature during the epitaxial growth is different from each other. In the graph, the abscissa axis represents the depth ($\mu$m) from the upper surface 11a; and the ordinate axis represents the oxygen concentration ($cm^{-3}$). Here, the graph L4 represents the data of an epitaxial layer 16, which has been obtained under the following conditions; i.e., a vacuum with ion pump and diffusion pump (ultimate vacuum: $2 \times 10^{-10}$ Torr or less), at a substrate temperature of 590° C. The graph L5 represents the data of an epitaxial layer 16, which has been obtained under the following conditions; i.e., a vacuum with ion pump and diffusion pump (ultimate vacuum: $2 \times 10^{-10}$ Torr or less), at a substrate temperature of 200° C. The graph L6 represents the data of an epitaxial layer 16, which has been obtained under the following conditions; i.e., a vacuum with ion pump only (ultimate vacuum: $2 \times 10^{-9}$ Torr or less), at a substrate temperature of 200° C.

As demonstrated in the graph, in the area corresponding to the epitaxial layer 16 at a depth of 1.7 $\mu$m or less, according to the graph L4, the oxygen concentration is $1 \times 10^{16} - 2 \times 10^{16}$ $cm^{-3}$; according to the graph L5, the oxygen concentration is $1 \times 10^{17}$ $cm^{-3}$; and according to the graph L6, the oxygen concentration is $5 \times 10^{17}$ $cm^{-3}$. Based on the results, the inventors have found that, by setting the substrate temperature during the epitaxial growing to approximately 200° C., the concentration of the oxygen implanted into the epitaxial layer 16 can be increased significantly. And the following fact has been found. That is, when the substrate temperature gradually decreases in accordance with the growth of the epitaxial layer 16, the closer to the upper surface 11a of the epitaxial layer 16, the higher the concentration of the oxygen is resulted in.

Further, as a result of the investigation into the relationship between the oxygen concentration and the carrier life time using pump-probe method, it was found that, in the case of the graph L5 (the concentration of oxygen: $1 \times 10^{17}$ $cm^{-3}$), the carrier life time is approximately 1 ps; and in the case of graph L6 (the concentration of oxygen: $5 \times 10^{17}$ $cm^{-3}$), the carrier life time is approximately 0.2 ps; and in the case of the conventional epitaxial growing, in which the oxygen concentration is not controlled, the carrier life time is approximately several ps. Accordingly, it can be understood that the concentration of oxygen in the epitaxial layer 16 contributes to the reduction of the carrier life time. That is, it is estimated that the higher concentration of the oxygen in the epitaxial layer 16, the shorter carrier life time is resulted in. Further, based on the above estimation, the following estimation can be drawn. That is, as compared with the case where the epitaxial layer 16 does not include the oxygen, in the case where the epitaxial layer 16 includes the oxygen, the carrier life time is further reduced. It can be understood that the reason of the reduction of the carrier life time by the oxygen is as described below. That is, a deep level of the oxygen, or complex defects due to the included oxygen is the preventive factor of the carrier mobility. Thus, by appropriately controlling the oxygen concentration, it is possible to achieve the life reduction of carriers of from several to sub ps order.

As described above in detail, in the semiconductor chip 11, the As/Ga concentration rate in the vicinity of the upper surface 11a, is approximately 1.02, and thus, the As concentration is higher than the Ga concentration. Further, while growing the epitaxial layer 16, by reducing the substrate temperature to approximately 200° C., the epitaxial layer 16 contains the oxygen therein. As described above, in the semiconductor chip 11, the As-clusters in the vicinity of the upper surface 11a, of the epitaxial layer 16 is significantly increased as well as the oxygen is included in the epitaxial layer 16. Accordingly, the life of the carriers is further reduced. Further, in the initial stage of the growth in the epitaxial layer 16, the As/Ga concentration increases toward the upper surface 11a of the epitaxial layer 16. Accordingly, in the initial stage of the growth, the crystal grows uniformly. As a result, the semiconductor chip 11 with satisfactory grown surface and high carrier mobility can be obtained.

And, on the semiconductor chip 11, dipole antenna (a pair of antenna electrodes 18A and 18B), which is made of AuGe/Au alloy, is formed; and thus, the terahertz electromagnetic-wave device 10 is obtained. That is, the terahertz electromagnetic-wave device 10, in which a lot of As-clusters 26 are included immediately under the pair of antenna electrodes 18A and 18B and in the vicinity of the upper surface 11a of the semiconductor chip 11 is obtained. The pair of antenna electrodes 18A and 18B are disposed and formed by means of known techniques of lithography and etching.

In the terahertz electromagnetic-wave device 10, since the semiconductor chip 11 is adopted, the life of the carriers, which are generated by the femtosecond laser pulse irradiated to the minute gap 24, is shorter than the conventional devices. And accompanying the reduction of the carrier life time, a further quick response of the terahertz electromagnetic-wave device 10 is achieved and a frequency band wider than the conventional devices can be handled.

As for the growing conditions of the epitaxial layer 16, in addition to the above-mentioned mode, in which the amount of the As supply is increased, a mode in which the amount of the Ga supply may be adopted. This can be achieved by opening and closing a Ga shutter of the MBE apparatus intermittently. Further a mode in which both of the As molecular beam and the Ga molecular beam are turned off to discontinue the growth of the epitaxial layer 16 may be adopted. In this case, every time the epitaxial layer 16 grows a predetermined amount (for example, 20 nm), the Ga shutter of the MBE apparatus is closed for approximately 1 to 2 minutes and the As molecular beam only is irradiated on the substrate. After that, the As shutter also closed for approximately 1 to 2 minutes, and the substrate surface is exposed to the atmosphere in the chamber to accelerate the oxidization of the surface. According to the above mode, the oxygen is imported in the vicinity of the boundary, where the growth of the atoms is interrupted; thus the amount of the oxygen is increased effectively. The above two modes can be used along with the above-mentioned mode in which the amount of the As supply is increased.

Also, as for the above-mentioned growing conditions of the epitaxial layer 16, the following mode has been described; i.e., the substrate temperature is gradually lowered and the amount of the As supply is continuously increased. However, these growing conditions may be changed to the following mode; i.e., the substrate temperature is lowered continuously, or the amount the As supply is gradually increased.

The present invention is not limited to the above-mentioned embodiments, but a variety of modifications are possible. For example, the materials for buffer layer and the epitaxial layer are not limited to two-component GaAs, a multi-component mixed crystal such as InGaAs, AlGaAs, AlInAs included in the Group III-V semiconductor materials may be used. As for the material for the single crystal semiconductor substrate is not limited to the GaAs. In addition to the Group III-V semiconductor material, Si, which hardly absorbs the terahertz electromagnetic wave, may be used. Also, the material for the antenna electrodes is not limited to the AuGa/Au, but any material, which allows ohmic contact with the epitaxial layer, may be used. Particularly, depending on the mode of the obtaining the current signal at detection of the terahertz electromagnetic wave and the analysis thereof, a Schottky-type electrode material may be adopted.

Further, the configuration of the antenna in the terahertz electromagnetic-wave device is not limited to the dipole type, depending on the irradiation characteristics of the terahertz electromagnetic wave, an antenna of bow tie type, spiral type or the like may be appropriately adopted. A terahertz spectroscopy system using antenna electrodes, which has the above configuration, is applicable to the physicality analysis, imaging or the like.

As described above, in accordance with to the present invention, a semiconductor chip in which the carrier life time has been further reduced, a terahertz electromagnetic-wave device, and a method of manufacturing these can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor chip applicable to a terahertz electromagnetic-wave device for generating and detecting terahertz electromagnetic waves, said semiconductor chip comprising:

a single crystal semiconductor substrate; and a Group III-V compound semiconductor layer provided on said single crystal semiconductor substrate, said Group III-V compound semiconductor layer having a first main surface facing said single crystal semiconductor substrate and a second main surface opposed to the first main surface, wherein, in the second main surface side of said Group III-V compound semiconductor layer, the concentration of Group V atoms is higher than the concentration of Group III atoms, and said Group III-V compound semiconductor layer includes oxygen.

2. A semiconductor chip applicable to a terahertz electromagnetic-wave device for generating and detecting terahertz electromagnetic waves, said semiconductor chip comprising:

a single crystal semiconductor substrate; and a Group III-V compound semiconductor layer provided on said single crystal semiconductor substrate, said Group III-V compound semiconductor layer having a first main surface facing said single crystal semiconductor substrate and a second main surface opposed to the first main surface, wherein, in the vicinity of the surface of said Group III-V compound semiconductor layer, the concentration of Group V atoms is higher than the concentration of Group III atoms, and the ratio of the concentration of the Group V atoms with respect to the concentration of the Group III atoms increases from the first main surface toward the second main surface of said Group III-V compound semiconductor layer.

3. A terahertz electromagnetic-wave device for generating and detecting terahertz electromagnetic waves, said terahertz electromagnetic-wave device comprising:

a single crystal semiconductor substrate;

a Group III-V compound semiconductor layer provided on said single crystal semiconductor substrate, said Group III-V compound semiconductor layer having a first main surface facing said single crystal semiconductor substrate and a second main surface opposed to the first main surface, and a pair of antenna electrodes provided on the second main surface of said Group III-V compound semiconductor layer and separated from each other by a minute gap, wherein, in the second main surface side of said Group III-V compound semiconductor layer, the concentration of Group V atoms is higher than the concentration of Group III atoms, and said Group III-V compound semiconductor layer includes oxygen.

4. A terahertz electromagnetic-wave device for generating and detecting terahertz electromagnetic waves, said terahertz electromagnetic-wave device comprising:

a single crystal semiconductor substrate;

a Group III-V compound semiconductor layer provided on said single crystal semiconductor substrate, said Group III-V compound semiconductor layer having a first main surface facing said single crystal semiconductor substrate and a second main surface opposed to the first main surface, and a pair of antenna electrodes provided on the second main surface of said Group III-V compound semiconductor layer and separated from each other by a minute gap, wherein, in the second main surface side of said Group III-V compound semiconductor layer, the concentration of Group V atoms is higher than the concentration of Group III atoms, and the ratio of the concentration of the Group V atoms with respect to the concentration of the Group III atoms increases from the first main surface toward the second main surface of said Group III-V compound semiconductor layer.

* * * * *